(12) United States Patent
Scholz

(10) Patent No.: US 9,094,018 B2
(45) Date of Patent: Jul. 28, 2015

(54) METHOD AND CONTROL DEVICE FOR CHARGING AN INTERMEDIATE CIRCUIT CAPACITOR FOR A WELDING DEVICE

(71) Applicant: Robert Bosch GmbH, Stuttgart (DE)

(72) Inventor: Reinhard Scholz, Erbach (DE)

(73) Assignee: Robert Bosch GmbH, Stuttgart (DE)

( * ) Notice: Subject to any disclaimer, the term of this patent is extended or adjusted under 35 U.S.C. 154(b) by 290 days.

(21) Appl. No.: 13/716,352

(22) Filed: Dec. 17, 2012

(65) Prior Publication Data

US 2013/0162223 A1    Jun. 27, 2013

(30) Foreign Application Priority Data

Dec. 24, 2011 (DE) .................. 10 2011 122 409
Mar. 23, 2012 (DE) .................. 10 2012 005 959

(51) Int. Cl.
| | | |
|---|---|---|
| *H02J 7/00* | (2006.01) | |
| *B23K 9/10* | (2006.01) | |
| *B23K 11/24* | (2006.01) | |
| *H03L 5/00* | (2006.01) | |
| *H02M 7/162* | (2006.01) | |
| *H02J 7/34* | (2006.01) | |
| *B23K 11/25* | (2006.01) | |

(52) U.S. Cl.
CPC .................. *H03L 5/00* (2013.01); *H02M 7/162* (2013.01); *B23K 11/24* (2013.01); *B23K 11/258* (2013.01); *H02J 7/0016* (2013.01); *H02J 7/345* (2013.01)

(58) Field of Classification Search
CPC ........ H02J 7/345; H02J 7/0016; B23K 11/24; B23K 11/00; B23K 11/258
USPC .................. 320/166; 219/111, 113, 115
See application file for complete search history.

(56) References Cited

U.S. PATENT DOCUMENTS

| | | | | |
|---|---|---|---|---|
| 3,504,157 | A * | 3/1970 | Vanderhelst | 219/110 |
| 3,588,435 | A * | 6/1971 | Eckl et al. | 219/108 |
| 3,590,326 | A * | 6/1971 | Watson | 361/96 |
| 4,965,860 | A * | 10/1990 | Jochi | 219/113 |
| 5,563,777 | A * | 10/1996 | Miki et al. | 363/37 |
| 5,844,193 | A * | 12/1998 | Nomura et al. | 219/110 |
| 5,965,038 | A * | 10/1999 | Nomura et al. | 219/110 |
| 6,046,424 | A * | 4/2000 | Jochi | 219/110 |
| 6,172,888 | B1 * | 1/2001 | Jochi | 363/89 |
| 6,320,774 | B2 * | 11/2001 | Jochi et al. | 363/98 |
| 2001/0008487 | A1 * | 7/2001 | Jochi et al. | 363/98 |
| 2001/0023857 | A1 * | 9/2001 | Watanabe | 219/110 |
| 2001/0047982 | A1 * | 12/2001 | Watanabe | 219/110 |
| 2014/0175065 | A1 * | 6/2014 | Hosokawa et al. | 219/117.1 |

* cited by examiner

*Primary Examiner* — Stacy Whitmore
(74) *Attorney, Agent, or Firm* — Maginot, Moore & Beck LLP

(57) ABSTRACT

A method for charging an intermediate-circuit capacitor for a welding device, includes feeding a voltage from a first chopping section of a first half-cycle of an AC voltage into the intermediate circuit capacitor, the first chopping section beginning at a first phase-related starting time; and feeding a voltage from a second chopping section of a second half-cycle of the AC voltage following the first half-cycle into the intermediate circuit capacitor, the second chopping section beginning at a second phase-related starting time, which is earlier than the first phase-related starting time.

10 Claims, 3 Drawing Sheets

METHOD AND CONTROL DEVICE FOR CHARGING AN INTERMEDIATE CIRCUIT CAPACITOR FOR A WELDING DEVICE

This application claims priority under 35 U.S.C. §119 to both (i) patent application no. DE 10 2011 122 409.6, filed on Dec. 24, 2011 in Germany, and (ii) DE 10 2012 005 959.0, filed on Mar. 23, 2012 in Germany. The disclosures of the above-identified patent applications are both incorporated herein by reference in their entirety.

BACKGROUND

The present disclosure relates to a method for charging an intermediate circuit capacitor for a welding device, to a control device for charging an intermediate circuit capacitor for a welding device and to a corresponding computer program.

A resistance welding device usually has an intermediate circuit electrolytic capacitor battery. These electrolytic capacitors cannot be connected directly to the power supply system, but are first charged with a low current. This precharging can be performed by a series power resistor, which limits the current. The electrolytic capacitors can also be charged by a charging switched mode power supply, which charges the electrolytic capacitors, for example with a constant current.

SUMMARY

Against this background, the object of the present disclosure is to provide a method for charging an intermediate circuit capacitor for a welding device, a control device for charging an intermediate circuit capacitor for a welding device and a corresponding computer program.

This object is achieved by a method for charging an intermediate circuit capacitor for a welding device, a control device for charging an intermediate circuit capacitor for a welding device and a corresponding computer program product, as described herein.

The present disclosure is based on the knowledge that, using phase gating control or phase chopping control, a charging current of an intermediate circuit capacitor can be limited. The phase gatings or phase choppings can become successively larger in order to increase an electrical voltage on the intermediate circuit capacitor in a controlled manner.

Advantageously, the intermediate circuit capacitor or alternatively or additionally the phase chopping control can be charged with low losses. Furthermore, separate apparatuses for providing a limited charging current can be dispensed with. As a result, a welding device can have a compact design and can be provided inexpensively.

The present disclosure provides a method for charging an intermediate circuit capacitor for a welding device, wherein the method has the following steps:
feeding a voltage from a first chopping section of a half-cycle of an AC voltage into the intermediate circuit capacitor, wherein the first chopping section begins at a first phase-related starting time; and
feeding a voltage from a second chopping section of a half-cycle of the AC voltage following the half-cycle into the intermediate circuit capacitor, wherein the second chopping section begins at a second phase-related starting time, which is earlier than the first phase-related starting time.

The present disclosure also relates to a control device for charging an intermediate circuit capacitor for a welding device, which control device is designed to implement or convert the steps of one variant of the method according to the disclosure in corresponding devices. By virtue of this variant embodiment of the disclosure in the form of a control device, the object on which the disclosure is based can also be achieved quickly and efficiently.

A control device is in this case understood to mean an electrical device which processes sensor signals or data signals and outputs control and/or data signals depending thereon. The control device can have an interface which can be hardware-based and/or software-based. In the case of a hardware-based design, the interfaces can be, for example, part of a so-called system ASIC, which contains a wide variety of functions of the control device. However, it is also possible for the interfaces to be dedicated integrated circuits or to at least partially comprise discrete components. In the case of a software-based design, the interfaces can be software modules, which are provided, for example, on a microcontroller in addition to other software modules.

Also advantageous is a computer program with program code, which can be stored on a machine-readable medium such as a semiconductor memory, a hard disk or an optical memory and is used for implementing the method according to one of the above-described embodiments when the program is run on a computer or an apparatus.

An intermediate circuit capacitor can be understood to mean an electrolytic capacitor or a film capacitor for smoothing a rectified voltage downstream of a rectifier and upstream of an inverter. A half-cycle can be a region of a wave-shaped voltage profile. For example, the half-cycle can be a region in which a voltage value of the voltage profile has a positive or negative mathematical sign. The half-cycle can be limited by two successive zero crossings of the voltage profile. The voltage profile can be an AC voltage. The AC voltage can have phase angles of half a wavelength within the half-cycle. At a start of the half-cycle, the phase angle can be zero. At an end of the half-cycle, the phase angle can be $180°$ or $\pi$, and the half-cycle can likewise extend between $180°$ or $\pi$ and $360°$ or $2\pi$. $2\pi$ can again be considered to be the zero point. Likewise, the phase angle can be considered continuously. One chopping section of the half-cycle can be a piece of the half-cycle. The chopping section can have a start point with a start angle, a start time and a start voltage value and an end point with an end angle, an end time and an end voltage value. A firing angle (which can also be referred to as phase-related starting time, as starting time of a chopping section within a half-cycle) can be the start angle of the chopping section. A phase-related starting time can be understood in the text which follows to mean a time in relation to the beginning of a half-cycle, wherein the chopping section under consideration is then defined as being from the starting time up to the time at which a voltage of zero volt is reached. The firing angle can correlate with a phase angle of the half-cycle that the AC voltage has at the start time of the chopping section. The end time can be a zero crossing of the AC voltage.

An angle difference between the first firing angle and the second firing angle can be less than a maximum angle difference. In other words, a difference between the first phase-related starting time and the second phase-related starting time can be less than a maximum predetermined difference or a maximum predetermined time. A predetermined maximum angle difference can limit an excessively high voltage rise at the intermediate circuit capacitor between the individual steps for feeding. As a result, the current flow can likewise be limited.

The method can have a step for determining the first phase-related starting time, wherein the first phase-related starting time is determined using a maximum permissible current on the intermediate circuit capacitor. As an alternative or in addition, the method can have a step for determining the second phase-related starting time, wherein the second phase-related starting time is determined using the maximum permissible current on the intermediate circuit capacitor. A present current on the intermediate circuit capacitor can be determined in a step for measuring. The phase-related starting times can be determined in such a way that a current rise during feeding is less than a maximum provided current rise that can be managed by the intermediate circuit capacitor without said intermediate circuit capacitor being subject to a defect.

The method can have a step for detecting a phase angle of the half-cycle and a phase angle of the following half-cycle, wherein the first phase-related starting time and the second phase-related starting time are determined in the steps for feeding using the phase angles. By way of example, the zero crossings or Maxima can be detected in order to detect the phase angle. The phase-related starting times can be matched relative to the phase angle.

The method can have a first step for detecting a voltage of the intermediate circuit capacitor prior to the first step for feeding, wherein the first phase-related starting times is determined using the voltage prior to the feeding. As an alternative or in addition, the method can have a second step for detecting the voltage of the intermediate circuit capacitor after the first step for feeding, wherein the second phase-related starting time is determined using the voltage after the first feeding. A voltage of the intermediate circuit capacitor can be an electrical voltage present between the poles of the intermediate circuit capacitor.

The first phase-related starting time can represent a voltage value of the half-cycle, which voltage value is a predetermined voltage difference greater than the voltage prior to the first step for feeding. As an alternative or in addition, the second phase-related starting time can represent a voltage value for the following half-cycle, which voltage value is the predetermined voltage difference greater than the voltage after the first feeding. As a result, an excessive rise in the voltage on the intermediate circuit capacitor between two successive half-cycles can be prevented.

The half-cycle can represent a part of a first phase of a polyphase AC voltage. The following half-cycle can be part of a second phase, shifted through a phase angle with respect to the half-cycle, of the polyphase AC voltage. For example, in the case of a three-phase AC voltage, the phases can have a phase shift of 120° or $\frac{2}{3}\pi$ with respect to one another. The half-cycles can overlap one another.

The method can have at least one further step for feeding, in which a voltage of a further chopping section of a further half-cycle of the AC voltage which follows the half-cycle or the following half-cycle is fed into the intermediate circuit capacitor, wherein the further chopping section begins at a further phase-related starting time, which is earlier than the second phase-related starting time.

The at least one further phase-related starting time can be reduced down to a predetermined minimum firing angle or minimum phase-related starting time. For example, at the predetermined minimum firing angle or the minimum phase-related starting time, a maximum rms value for the AC voltage can be achieved.

The at least one further phase-related starting time can be reduced until the intermediate circuit capacitor has a predetermined voltage. The predetermined voltage may be a set-point voltage. For example, the predetermined voltage can be a standby voltage in order to save energy.

The present disclosure also provides a welding device having the following features: an at least half-controlled rectifier for generating a DC voltage, an intermediate circuit capacitor for smoothing the DC voltage, wherein a positively chargeable contact of the intermediate circuit capacitor is connected to a connection of the rectifier, which connection outputs a positive voltage, and wherein a negatively chargeable contact of the intermediate circuit capacitor is connected to a connection of the rectifier which outputs a negative voltage; a control device for charging the intermediate circuit capacitor in accordance with the approach proposed here; and a device for generating a welding current, which is connected to the intermediate circuit capacitor in order to consume the DC voltage.

BRIEF DESCRIPTION OF THE DRAWINGS

The disclosure will be explained by way of example in more detail below with reference to the attached drawings, in which.

DETAILED DESCRIPTION

Identical or similar elements can be provided with the same or similar reference symbols in the figures below. In addition, the figures of the drawings, the description thereof and the claims contain numerous features in combination. It is clear to a person skilled in the art that these features can also be considered individually or can be combined to form further combinations not explicitly described here.

Figure 1:
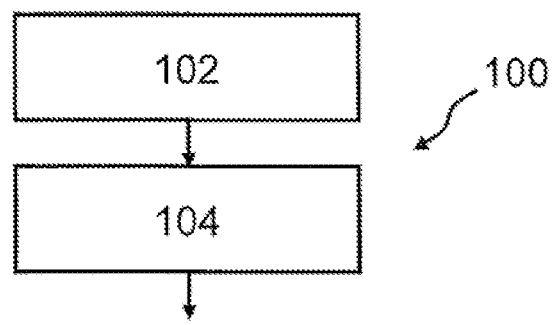
FIG. 1 shows a flowchart of a method for charging an intermediate circuit capacitor in accordance with one exemplary embodiment of the disclosure.

FIG. 1 shows a flowchart of a method 100 for charging an intermediate circuit capacitor of a welding device in accordance with one exemplary embodiment of the disclosure. The method has two successive steps for feeding 102, 104. In the first step for feeding 102, a voltage from a first chopping section of a half-cycle of an AC voltage is fed into the intermediate circuit capacitor, wherein the first chopping section begins at a first phase-related starting time. In the following second step for feeding, a voltage from a second chopping section of a following half-cycle of the AC voltage is fed into the intermediate circuit capacitor, wherein the second part begins at a second phase-related starting time, which is earlier than the first phase-related starting time. In relation to consideration of the firing angle, this means that the second phase-related starting time is smaller than the first phase-related starting time.

Figure 2:
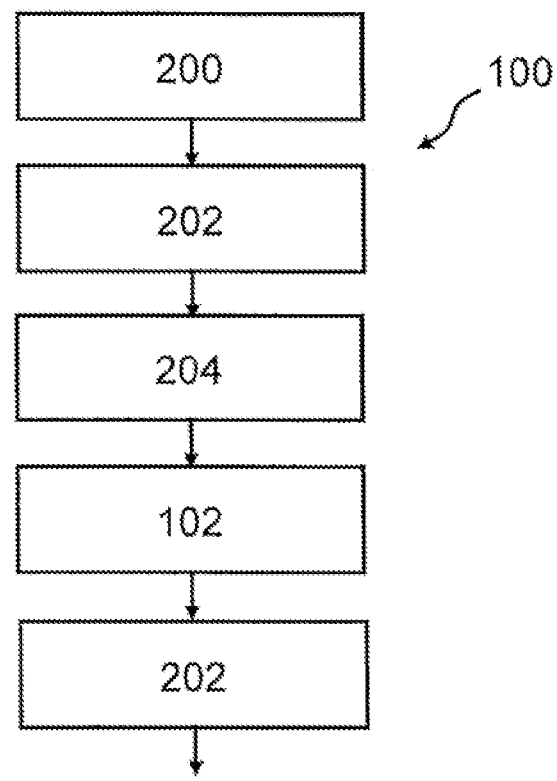
FIG. 2 shows a flowchart of part of a method for charging an intermediate circuit capacitor in accordance with an exemplary embodiment of the disclosure.

FIG. 2 shows a flowchart of part of a method 100 for charging an intermediate circuit capacitor in accordance with a further exemplary embodiment of the disclosure. In the part, the method 100 in this exemplary embodiment has a step for detecting 200, a step for measuring 202, a step for determining 204, a step for feeding 102 and a further step for measuring 202. The steps in the method 100 or a variant thereof can additionally be implemented in the method 100 in FIG. 1. In the step for detecting 200, a phase angle of the AC voltage is detected. In this exemplary embodiment, a frequency and amplitude of the AC voltage is known since the AC voltage is a system voltage with the system frequency. In the case of an unknown AC voltage, the frequency and amplitude of the AC voltage can likewise be sensed in the step for detecting. The phase angle is detected on the basis of notable characteristic voltage values for the AC voltage. For example, zero crossings of the AC voltage can be identified in order to identify the phase angle of the AC voltage. In the step for measuring 202, a voltage at connections of the intermediate circuit capacitor is measured. In a step for determining 204, the first firing angle (phase-related starting time) for a controllable rectifier component part is determined. In the firing angle (phase-related starting time), the AC voltage has a value which is a predetermined difference higher than the measured voltage at the capacitor in order that charge can flow into the capacitor. In the step for feeding 102, the rectifier component part is on when the AC voltage has the firing angle. The rectifier component part remains on until the mathematical sign of the voltage is reversed. As long as the instantaneous voltage of the AC voltage is higher than the instantaneous voltage at the capacitor, charge flows into the capacitor. In the second step for measuring, the voltage at the capacitor is measured in order to determine the firing angle in the following step (not illustrated) for determining the second firing angle in such a way that in the second step for feeding (likewise not illustrated), further charge can flow into the capacitor. The steps in the method 100 can be implemented until the voltage in the intermediate circuit capacitor corresponds to the rms voltage of the AC voltage. Likewise, the voltage in the intermediate circuit capacitor can be limited to a predetermined value.

Figure 3:
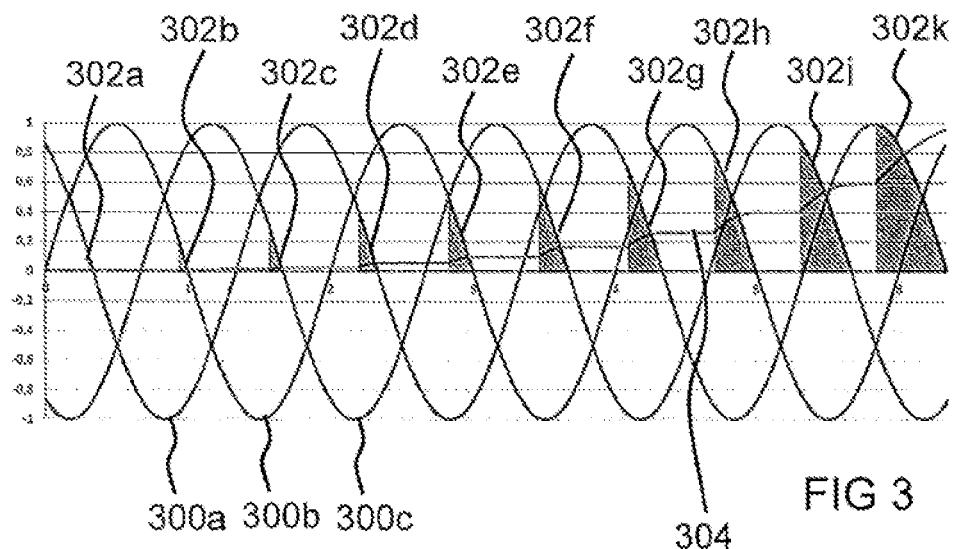
FIG. 3 shows a graph of voltage profiles and chopping sections with decreasing firing angles in different successive half-cycles in accordance with one exemplary embodiment of the present disclosure.

FIG. 3 shows a graph of voltage profiles 300 and chopping sections 302 with descending (i.e. decreasing in size) firing angles in accordance with an exemplary embodiment of the present disclosure. Furthermore, the illustration shows an increasing voltage 304 at the intermediate circuit capacitor. The voltages illustrated here from the chopping sections 302a to 302k can be fed into the intermediate circuit capacitor of a welding device by means of a method in accordance with the approach proposed here in order thereby to increase the voltage 304 while a current flow at the capacitor is limited.

The figure illustrates the voltage profiles 300, the chopping sections 302 and the voltage 304 in a graph which has a phase angle of the voltage profiles 300 in radians (π) as the x axis. A voltage value standardized to 1 from −1 through 0 to +1 is plotted on the y axis. The x axis begins at 0π and is illustrated to beyond 6π. The voltage profiles 300a, 300b and 300c represent the three phases L1, L2 and L3 of a three-phase AC voltage. They have a sinusoidal form with a wavelength of 2π and an amplitude of 1. The voltage profiles 300 are shifted through 120° or ⅔π with respect to one another. All of the voltage profiles 300 are illustrated over three complete wavelengths. One wavelength is divided into a positive half-cycle with positive voltage values and a length of 1π and into a negative half-cycle with negative voltage values and likewise a length of 1π. In this exemplary embodiment, only the positive half-cycles are used for feeding the chopping sections 302. Likewise, the negative half-cycles or positive and negative half-cycles together can be used.

In response to a charging signal from a control device in accordance with an exemplary embodiment of the present disclosure, a first chopping section 302a from a first half-cycle of the phase 300a is fed into the intermediate circuit capacitor by means of a first switchable component part (diode, thyristor, transistor, or the like) of a half-controlled bridge rectifier (i.e. a bridge rectifier in which only a rectifier element for rectifying a positive or negative voltage of the AC voltage is provided). The first chopping section 302a has a first firing angle, at which the first component part is switched on. The first firing angle is slightly less than 1π and is shortly before the zero crossing of the phase 300a. Thus, the first chopping section 302a has a low start voltage of below 0.1. The voltage 304 hardly increases. The second chopping section 302b is fed from a following first half-cycle of the phase 300b into the intermediate circuit capacitor. The second chopping section 302b has a second firing angle, which is less than the first firing angle. The second chopping section 302b has a start voltage of below 0.2. The voltage 304 at the intermediate circuit capacitor increases slightly. The third chopping section 302c is fed from a following first half-cycle of the phase 300c into the intermediate circuit capacitor. The firing angle of the third chopping section 302c is again less than the firing angle of the second chopping section 302b. A start voltage of the third chopping section 302d is thus below 0.3. The voltage 304 increases notably. The fourth chopping section 302d is fed from a following second half-cycle of the phase 300a into the intermediate circuit capacitor. The firing angle of the fourth chopping section 302d is again less than the firing angle of the third chopping section 302c. A start voltage of the fourth chopping section 302d is thus below 0.4. The voltage 304 increases. The fifth chopping section 302e is fed from a following second half-cycle of the phase 300b into the intermediate circuit capacitor. The firing angle of the fifth chopping section 302e is again less than the firing angle of the fourth chopping section 302d. A start voltage of the fifth chopping section 302e is thus below 0.5. The voltage 304 increases up to 0.1. The sixth chopping section 302f is fed from a following second half-cycle of the phase 300c into the intermediate circuit capacitor. The firing angle of the sixth chopping section 302f is again less than the firing angle of the fifth chopping section 302e. A start voltage of the sixth chopping section 302f is thus below 0.6. The voltage 304 increases to just below 0.2. The seventh chopping section 302g is fed from a following third half-cycle of the phase 300a into the intermediate circuit capacitor. The firing angle of the seventh chopping section 302g is again less than the firing angle of the sixth chopping section 302f. A start voltage of the seventh chopping section 302g is thus below 0.7. The voltage 304 increases to just below 0.3. The eighth chopping section 302h is fed from a following third half-cycle of the phase 300b into the intermediate circuit capacitor. The firing angle of the eighth chopping section 302h is again less than the firing angle of the seventh chopping section 302g. A start voltage of the eighth chopping section 302h is thus below 0.8. The voltage 304 increases to 0.4. The ninth chopping section 302j is fed from a following third half-cycle of the phase 300c into the intermediate circuit capacitor. The firing angle of the ninth chopping section 302j is again less than the firing angle of the eighth chopping section 302h. A start voltage of the ninth chopping section 302j is thus below 0.9. The voltage 304 increases to 0.6. The tenth chopping section 302k is fed from a following fourth half-cycle of the phase 300a into the intermediate circuit capacitor. The firing angle of the tenth chopping section 302k is again less than the firing angle of the ninth chopping section 302j. A start voltage of the tenth chopping section 302k is thus below 1. The voltage 304 increases to over 0.9. The intermediate circuit capacitor is now charged.

It is also particularly advantageous if a superordinate controller detects the respective operating state of the system first in the temporal sequence. These operating states can be, for example, a charging operation, generation of a reduced voltage (standby or sleep mode), normal operation with a minimum firing angle or disconnection. Depending on the respective operating state, charging of the intermediate circuit capacitor can then take place, with the result that charging of the intermediate circuit capacitor does not need to take place in all cases, but a different charge amount is introduced into the intermediate circuit capacitor depending on the operating state (i.e. the intermediate circuit capacitor is charged to a corresponding voltage).

Figure 4:
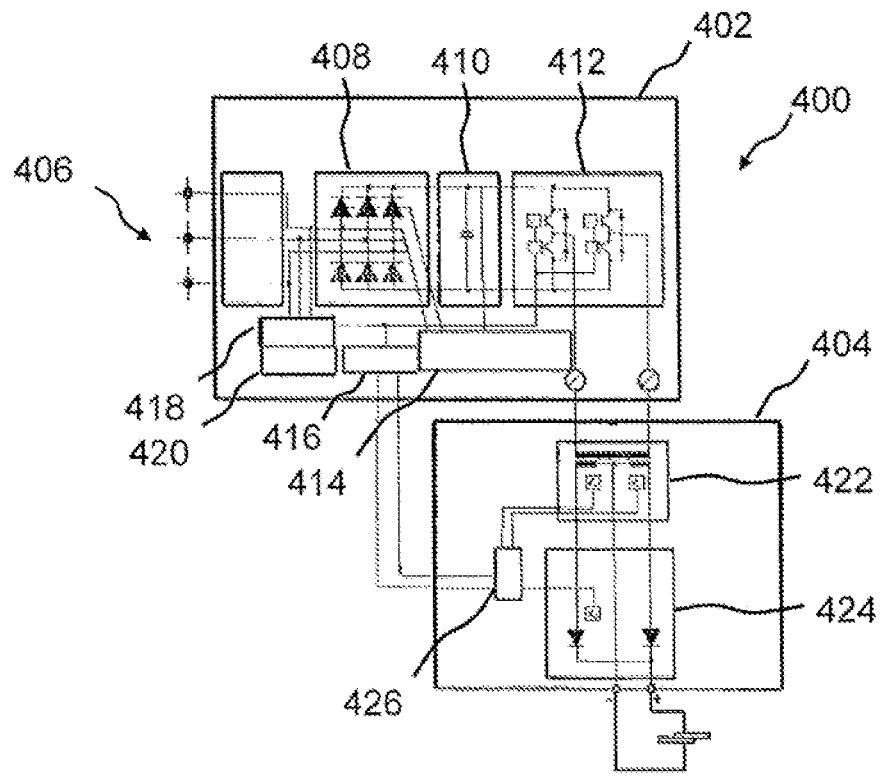
FIG. 4 shows an illustration of a welding device in accordance with one exemplary embodiment of the present disclosure.

FIG. 4 shows an illustration of a welding device 400 in accordance with an exemplary embodiment of the present disclosure. The welding device comprises two separate units, namely an inverter 402 and a transformer rectifier 404. The two units are connected to one another via electrical lines.

The inverter 402 is connected to a three-phase AC voltage power supply system 406. The three-phase AC voltage power supply system 406 has three phases L1, L2 and L3. The inverter has a half-controlled bridge rectifier 408, an intermediate circuit capacitor 410, an inverter 412, a control device 414 in accordance with an exemplary embodiment of the present disclosure, a welding processor 416 and a voltage supply device 418 with a driver 420. The bridge rectifier 408 is connected to the power supply system 406 and is designed to convert the AC voltages of the phases L1, L2 and L3 into a DC voltage. The intermediate circuit capacitor 410 is connected to the bridge rectifier 408 and is designed to reduce a ripple of the DC voltage from the rectifier 408. The inverter 412 is connected to the intermediate circuit capacitor 410 and is designed to convert the DC voltage into a medium-frequency AC voltage. This AC voltage is passed to the transformer rectifier 404 via the electrical lines. The control device 414 is connected to the power supply system 406, the bridge rectifier 408 and the intermediate circuit capacitor 410. The control device 414 is designed to determine a phase angle of the power supply system 406, to control feeding of half-cycle chopping sections with variable start time into the intermediate circuit capacitor 410 and to monitor a voltage and/or a current flow at the intermediate circuit capacitor 410. The welding processor 416 is connected to the voltage supply device 418, the inverter 412 and the transformer rectifier 404 via a bus system. The welding processor 416 is designed to actuate IGBTs (Insulated Gate Bipolar Transistors) of the inverter 412 in order to provide the medium-frequency AC voltage at the transformer rectifier 404, as required.

The transformer rectifier 404 has a welding transformer 422, a rectifier 424 and a sensor system 426. The welding transformer 422 is connected to the inverter 412 and is designed to transform a current of the medium-frequency AC voltage to a welding current. The rectifier 424 is connected to the welding transformer 422 and is designed to convert the medium-frequency AC voltage into a medium-frequency DC voltage, which can be used for a welding operation. The sensor system 426 has sensors in the welding transformer 422 and the rectifier 424 and is connected to the welding processor 416 for transmission of data.

The control device 414 is designed to keep a charging current within a predetermined tolerance during charging of the intermediate circuit capacitor 410 by virtue of an increasing charge voltage being provided by means of pulse width modulation with increasing pulse width from the half-controlled bridge rectifier 408, as is illustrated in FIG. 3.

In other words, with the aid of the use of a half-controlled B6 bridge 408 by means of voltage-dependent actuation of the thyristors, a charging resistor or the charging switched mode power supply for charging the intermediate circuit capacitor 410 can be dispensed with. By virtue of the actuation of the thyristors after a phase angle of approximately 220 decreasing, the precharging function can be met. By virtue of the use of the B6 bridge 408, system losses can be reduced.

By virtue of the actuation of the thyristors, a simple and quick-response charging circuit for the intermediate circuit electrolytic capacitors 410 results. Furthermore, with this control, a standby function with reduced intermediate circuit voltage or a sleep mode with disconnected intermediate circuit voltage can be implemented. Nevertheless, it is possible to be weld-ready again quickly.

In accordance with one exemplary embodiment of the present disclosure, the actuation of the half-controlled bridge takes place using a voltage measurement of the system voltages. The firing angle of the thyristors is changed on the basis of the voltage measurement per phase. Alternatively, the firing angle can also be altered by temporal control. Corresponding to a difference between the system voltage and the intermediate circuit voltage, the control angle can be reduced in equal increments until the thyristors are then actuated continuously for the required 120°.

The standby function can be achieved, for example, by regulating the intermediate circuit voltage to half the voltage value. Then, the half-controlled bridge 408 at the actuation angle is fired only every twentieth system period, for example, as during the charging operation. This results in fewer losses by virtue of the lack of firing energy during each system period. Furthermore, forward power losses of the thyristors are avoided. In addition, substantially fewer losses result in the balancing resistors of the electrolytic capacitor battery and owing to the lower residual current of the electrolytic capacitors. The standby function can be triggered by a superordinate controller 416, under the boundary condition that the system 400 is again weld-ready after 50 ms, for example.

The sleep function can also be activated by the superordinate controller 416. During the sleep function, the half-controlled bridge 408 is completely blocked, with the result that the intermediate circuit 410 is discharged. For renewed welding, in the sleep function one second can then elapse, for example, until the intermediate circuit voltage has reached its setpoint value. A delay can also depend on the revival of the controller 416, which can also transfer to the sleep mode.

Figure 5:
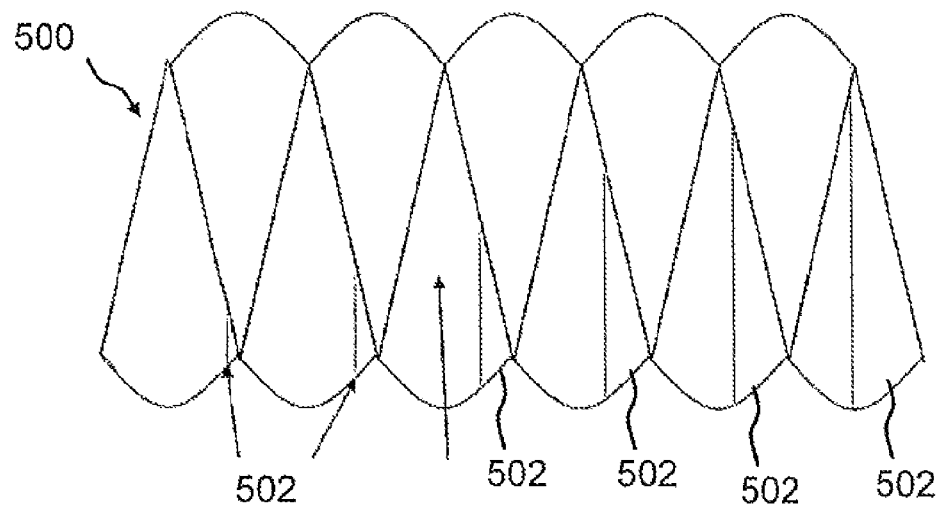
FIG. 5 shows an illustration of a voltage profile in accordance with an exemplary embodiment of the present disclosure.
Figure 6:
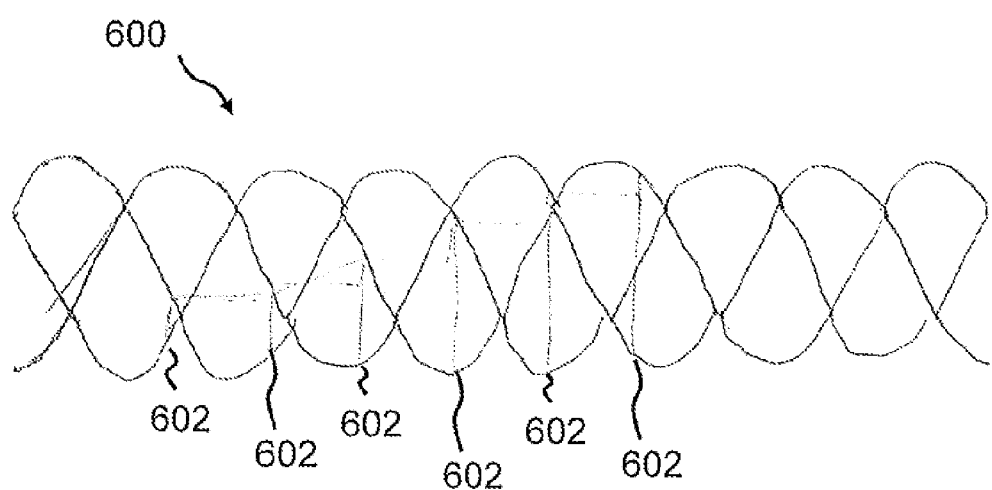
FIG. 6 shows an illustration of a voltage profile in accordance with an exemplary embodiment of the present disclosure.

FIGS. 5 and 6 show, in principle, the effect of the prior shift in the firing time in accordance with exemplary embodiments of the present disclosure given approximately sinusoidal AC voltages.

FIG. 5 shows an illustration of a voltage profile 500 in accordance with an exemplary embodiment of the present disclosure. Similarly to the voltage profiles in FIG. 3, a three-phase AC voltage 500 with a falling edge to rising components 502 feeds into the intermediate circuit capacitor. At the beginning of the components 502, in each case one thyristor in the rectifier is fired in order to be turned on. As a result, the intermediate circuit voltage 504 increases approximately linearly in this exemplary embodiment.

FIG. 6 shows an illustration of a voltage profile 600 in accordance with an exemplary embodiment of the present disclosure. As in FIG. 5, the decreasing firing angles 602 are illustrated. In contrast to FIG. 5, the profile of the voltage at the intermediate circuit capacitor is illustrated as increasing monotonically.

The exemplary embodiments shown are only selected by way of example and can be combined with one another.

LIST OF REFERENCE SYMBOLS

100 Method for charging
102 First step for feeding

104 Second step for feeding
200 Step for detecting
202 Step for measuring
204 Step for determining
300 AC voltage
302 Chopping section
304 Voltage on intermediate circuit capacitor
400 Welding device
402 Inverter
404 Transformer rectifier
406 Three-phase AC voltage
408 Bridge rectifier
410 Intermediate circuit capacitor
412 Inverter
414 Control device for charging
416 Welding processor
418 Voltage supply
420 Driver
422 Welding transformer
424 Rectifier
426 Sensor system
500 AC voltage
502 Chopping section
600 AC voltage
602 Firing angle

What is claimed is:

1. A method for charging an intermediate-circuit capacitor for a welding device, comprising:
feeding a voltage from a first chopping section of a first half-cycle of an AC voltage into the intermediate circuit capacitor, the first chopping section beginning at a first phase-related starting time; and
feeding a voltage from a second chopping section of a second half-cycle of the AC voltage following the first half-cycle into the intermediate circuit capacitor, the second chopping section beginning at a second phase-related starting time, which is earlier than the first phase-related starting time.

2. The method according to claim 1, wherein in the feeding the voltage from the second chopping section, a difference between the first phase-related starting time and the second phase-related starting time is less than a maximum difference.

3. The method according to claim 1, further comprising:
determining the first phase-related starting time using a maximum permissible current on the intermediate circuit capacitor; and/or
determining the second phase-related starting time using the maximum permissible current on the intermediate circuit capacitor.

4. The method according to claim 1, comprising:
detecting a phase angle of the first half-cycle and a phase angle of the second half-cycle following the first half-cycle,
wherein the first phase-related starting time and the second phase-related starting time are determined in (i) the feeding a voltage from a first chopping section, and (ii) the feeding a voltage from a second chopping section.

5. The method according to claim 1, further comprising:
detecting a voltage of the intermediate circuit capacitor prior to the feeding a voltage from a first chopping section, wherein the first phase-related starting time is determined using the voltage prior to the feeding; and/or
detecting the voltage of the intermediate circuit capacitor after the feeding a voltage from a first chopping section, wherein the second phase-related starting time is determined using the voltage after the first feeding.

6. The method according to claim 5, wherein:
the first phase-related starting time represents a voltage value of the first half-cycle, which voltage value is a predetermined voltage difference greater than the voltage prior to the feeding, and/or
the second phase-related starting time represents a voltage value of the second half-cycle, which voltage value is the predetermined voltage difference greater than the voltage after the first feeding.

7. The method according to claim 1, wherein:
in the feeding a voltage from a first chopping section, the first half-cycle represents part of a first phase of a polyphase AC voltage, and
in the feeding a voltage from a second chopping section, the second half-cycle following the first half-cycle represents part of a second phase, shifted through a phase angle with respect to the first half-cycle, of the polyphase AC voltage.

8. The method according to claim 1, further comprising:
feeding a voltage from a further chopping section of a further half-cycle of the AC voltage following the first half-cycle or the second half-cycle into the intermediate circuit capacitor,
wherein the further chopping section begins at a further phase-related starting time, which is earlier than the second phase-related starting time.

9. A control device for charging an intermediate circuit capacitor for a welding device, comprising:
a first unit configured to feed a voltage from a first chopping section of a half-cycle of an AC voltage into the intermediate circuit capacitor, the first chopping section beginning at a first phase-related starting time; and
a second unit configured to feed a voltage from a second chopping section of a half-cycle of the AC voltage following the half-cycle into the intermediate circuit capacitor, the second chopping section beginning at a second phase-related starting time, which is earlier than the first phase-related starting time.

10. A non-transitory computer-readable storage medium having stored therein a program code, when executed by a computing device, causes a control device configured to charge an intermediate-circuit capacitor for a welding device to implement a method, the method comprising:
(i) feeding a voltage from a first chopping section of a first half-cycle of an AC voltage into the intermediate circuit capacitor, the first chopping section beginning at a first phase-related starting time, and
(ii) feeding a voltage from a second chopping section of a second half-cycle of the AC voltage following the first half-cycle into the intermediate circuit capacitor, the second chopping section beginning at a second phase-related starting time, which is earlier than the first phase-related starting time.

* * * * *